United States Patent
Rekken

(10) Patent No.: US 11,485,642 B2
(45) Date of Patent: Nov. 1, 2022

(54) SIH-FREE VINYLDISILANES

(71) Applicant: DOW SILICONES CORPORATION, Midland, MI (US)

(72) Inventor: Brian D. Rekken, Midland, MI (US)

(73) Assignee: DDP Specialty Electronic Materials US 9, LLC, Wilmington, DE (US)

(*) Notice: Subject to any disclaimer, the term of this patent is extended or adjusted under 35 U.S.C. 154(b) by 133 days.

(21) Appl. No.: 16/331,161

(22) PCT Filed: Sep. 15, 2017

(86) PCT No.: PCT/US2017/051710
§ 371 (c)(1),
(2) Date: Mar. 7, 2019

(87) PCT Pub. No.: WO2018/057411
PCT Pub. Date: Mar. 29, 2018

(65) Prior Publication Data
US 2019/0284055 A1    Sep. 19, 2019

Related U.S. Application Data

(60) Provisional application No. 62/398,174, filed on Sep. 22, 2016.

(51) Int. Cl.
| | | |
|---|---|---|
| C01B 33/107 | (2006.01) | |
| C01B 21/088 | (2006.01) | |
| C07F 7/08 | (2006.01) | |
| C23C 16/30 | (2006.01) | |
| C23C 16/455 | (2006.01) | |
| C23C 16/50 | (2006.01) | |

(52) U.S. Cl.
CPC .......... C01B 33/107 (2013.01); C01B 21/088 (2013.01); C07F 7/0803 (2013.01); C23C 16/30 (2013.01); C23C 16/45536 (2013.01); C23C 16/45553 (2013.01); C23C 16/50 (2013.01); C01P 2006/40 (2013.01)

(58) Field of Classification Search
CPC .... C01B 33/107; C01B 21/088; C07F 7/0803
See application file for complete search history.

(56) References Cited

U.S. PATENT DOCUMENTS

| | | |
|---|---|---|
| 2016/0326642 A1 | 11/2016 | Hara et al. |
| 2017/0029446 A1 | 2/2017 | Ketola et al. |

FOREIGN PATENT DOCUMENTS

| | | | |
|---|---|---|---|
| CN | 101602918 A | 12/2009 | |
| EP | 0798301 A1 * | 3/1997 | ............... C07F 7/08 |
| EP | 0798301 A1 | 10/1997 | |
| JP | 60151278 A | 8/1985 | |
| JP | 61207389 A | 9/1986 | |
| JP | 61207390 A | 9/1986 | |
| JP | 61207391 A | 9/1986 | |
| JP | 08277292 A | 10/1996 | |
| JP | 2007191797 A | 8/2007 | |
| WO | 2015184214 A1 | 12/2015 | |

OTHER PUBLICATIONS

Trommer et al., "New olefinic functionalized disilanes. Synthesis and NMR spectroscopical investigations," J. Org. Chem. 540 (1997) 119-125. (Year: 1997).*

K. Trommer, et al., "Disproportionation of chlorodisilanes containing vinyl, diethyiamino or phenyl substituents", Main Group Metal Chemistry, 2001, pp. 425-433, vol. 24, No. 7.

Search report for corresponding Taiwan Application No. 106132149 dated Dec. 29, 2020.

* cited by examiner

Primary Examiner — Catherine S Branch
(74) Attorney, Agent, or Firm — S. Matthew Cairns

(57) ABSTRACT

A SiH-free vinyldisilane compound, which is free of (lacks) a silicon-bonded hydrogen atom. The use of the SiH-free vinyldisilane compound, or a collection of such compounds, as a starting material or precursor for synthesizing or making silicon-heteroatom compounds. The silicon-heteroatom compounds synthesized therefrom; films of and devices containing the silicon-heteroatom compounds; methods of making the SiH-free vinyldisilane compound, silicon-heteroatom compounds, films, and devices; and uses of the SiH-free vinyldisilanes, silicon-heteroatom compounds, films, and devices.

10 Claims, No Drawings

SIH-FREE VINYLDISILANES

TECHNICAL FIELD

SiH-free vinyldisilanes; silicon-heteroatom compounds synthesized therefrom; films of and devices containing the silicon-heteroatom compounds; methods of making the SiH-free vinyldisilanes, silicon-heteroatom compounds, films, and devices; and uses of the SiH-free vinyldisilanes, silicon-heteroatom compounds, films, and devices.

BACKGROUND OF THE RELATED ART

Films of silicon-heteroatom compounds may act as dielectric, barrier, or stressor layers in electronic devices or microelectromechanical system (MEMS). The films may be formed on a surface of a component of the electronic device or MEMS in need of such action by subjecting one or more suitable precursor compounds to film deposition methods in the presence of the component. The precursor compounds are small molecules, oligomers, or macromolecules that vaporize and react with or decompose on the surface of the component in such a way so as to form a thin conformal coating of the silicon-heteroatom compound thereon. In order to form satisfactorily-performing films, incumbent precursor compounds may need to be heated at high temperatures (e.g., 600° to 1,000° C.).

BRIEF SUMMARY OF THE INVENTION

We (the present inventors) have discovered problems with incumbent precursor compounds. Some incumbent precursor compounds contain impurities that will contaminate the electronic device or MEMS. In order to form satisfactory films of silicon-heteroatom compounds some incumbent precursor compounds need to be heated at temperatures that degrade thermally-sensitive features of the components being coated. Also, some of the films may be defective, e.g., undesired thicknesses or densities or lacking satisfactory uniformity.

We provide a technical solution to one or more of these problems. Our technical solution comprises a SiH-free vinyldisilane compound, which is free of (lacks) a silicon-bonded hydrogen atom. The technical solution further comprises the use of the SiH-free vinyldisilane compound, or a collection of such compounds, as a starting material or precursor for synthesizing or making silicon-heteroatom compounds, which are different in composition and structure from the SiH-free vinyldisilane compound. The technical solution further comprises the silicon-heteroatom compounds synthesized therefrom; films of and devices containing the silicon-heteroatom compounds; methods of making the SiH-free vinyldisilane compound, silicon-heteroatom compounds, films, and devices; and uses of the SiH-free vinyldisilanes, silicon-heteroatom compounds, films, and devices.

DETAILED DESCRIPTION OF THE INVENTION

The Brief Summary and Abstract are incorporated here by reference. As used herein, the adjective "SiH-free" means a molecule lacking a silicon-bonded hydrogen atom, or a collection of such molecules. The term "SiH-free vinyldisilane compound" means a molecule consisting of two silicon atoms and six silicon-bonded substituents, at least one of which is a silicon-bonded vinyl group; or a collection of such molecules, which are independently the same or different. This invention is described herein in an illustrative manner by disclosing a plurality of representative, non-limiting embodiments and examples. In some embodiments the invention is any one of the following numbered aspects.

Aspect 1. A SiH-free vinyldisilane compound independently consisting of 6 silicon-bonded substituents selected from 1 to 5 silicon-bonded vinyl groups and 5 to 1 silicon-bonded substituents, respectively, independently selected from silicon-bonded chlorine atoms and silicon-bonded dialkylamino groups; with the proviso that when there is only 1 silicon-bonded vinyl group, there is at least 1 silicon-bonded dialkylamino group.

Aspect 2. The SiH-free vinyldisilane compound of aspect 1 wherein the silicon-bonded substituents consist of 1 to 5 silicon-bonded vinyl groups and 5 to 1 silicon-bonded chlorine atoms, respectively.

Aspect 3. The SiH-free vinyldisilane compound of aspect 2 that is a per(chloro,vinyl)disilane consisting of 2 or 3 silicon-bonded vinyl groups and 4 or 3 silicon-bonded chlorine atoms, respectively.

Aspect 4. The SiH-free vinyldisilane compound of aspect 2 or 3 that is a per(chloro,vinyl)disilane selected from: 1,1-divinyl-1,2,2,2-tetrachlorodisilane; 1,2-divinyl-1,1,2,2-tetrachlorodisilane; 1,1,1-trichloro-2,2,2-trivinyldisilane; and 1,1,2-trichloro-1,2,2-trivinyldisilane. I.e., $(H_2C=C(H)-)_2SiClSiCl_3$; $(H_2C=C(H)-)SiCl_2Si(Cl)_2(-(H)C=CH_2)$; $Cl_3SiSi(-(H)C=CH_2)_3$; and $(H_2C=C(H)-)SiCl_2SiCl(-(H)C=CH_2)_2$; respectively.

Aspect 5. The SiH-free vinyldisilane compound of aspect 1 wherein the silicon-bonded substituents consist of 1 to 5 silicon-bonded vinyl groups, 4 to 0 silicon-bonded chlorine atoms, and 5 to 1 silicon-bonded dialkylamino groups, respectively.

Aspect 6. The SiH-free vinyldisilane compound of aspect 5 wherein the silicon-bonded substituents consist of 1 to 5 silicon-bonded vinyl groups and from 5 to 1 silicon-bonded dialkylamino groups, respectively.

Aspect 7. The SiH-free vinyldisilane compound of aspect 5 or 6 wherein each dialkylamino group is independently selected from N,N-diethylamino; N-ethyl-N-(1-methylethyl)amino; and N,N-di(1-methylethyl)amino.

Aspect 8. The SiH-free vinyldisilane compound of aspect 6 or 7 that is a per(dialkylamino,vinyl)disilane wherein the silicon-bonded substituents consist of 4 silicon-bonded vinyl groups and 2 silicon-bonded dialkylamino groups.

Aspect 9. The SiH-free vinyldisilane compound of aspect 8 that is a per(dialkylamino,vinyl)disilane independently selected from 1,2-bis(N,N-diethylamino)-1,1,2,2-tetravinyldisilane and 1,2-bis(N,N-di(1-methylethyl)amino)-1,1,2,2-tetravinyldisilane. I.e., $[(CH_3CH_2)_2N-](H_2C=C(H)-)_2SiSi(-(H)C=CH_2)_2[-N(CH_2CH_3)_2]$ and $[((CH_3)_2CH)_2N-](H_2C=C(H)-)_2SiSi(-(H)C=CH_2)_2[-N(CH(CH_3)_2)_2]$; respectively.

Aspect 10. The SiH-free vinyldisilane compound of aspect 5 wherein the silicon-bonded substituents consist of from 1 to 4 silicon-bonded vinyl groups, from 4 to 1 silicon-bonded chlorine atoms, and from 4 to 1 silicon-bonded dialkylamino groups, respectively.

Aspect 11. The SiH-free vinyldisilane compound of aspect 10 wherein each dialkylamino group is independently selected from N,N-diethylamino; N-ethyl-N-(1-methylethyl)amino; and N,N-di(1-methylethyl)amino.

Aspect 12. The SiH-free vinyldisilane compound of aspect 10 or 11 that is a per(chloro,dialkylamino,vinyl)disilane consisting of from 1 to 3 silicon-bonded vinyl groups, from 4 to 1 silicon-bonded chlorine atoms, and from 2 to 1 silicon-bonded dialkylamino groups.

Aspect 13. The SiH-free vinyldisilane compound of aspect 12 that is a per(chloro,dialkylamino,vinyl)disilane independently selected from 1,2-bis(N,N-diethylamino)-1, 1-dichloro-2,2-divinyldisilane; 1-(N,N-di(1-methylethyl)amino)-1,1,2,2-tetrachloro-2-vinyldisilane; 1-(N,N-di(1-methylethyl)amino)-1,1,2-trichloro-2,2-divinyldisilane; and 1-(N,N-di(1-methylethyl)amino)-1,1-dichloro-2,2,2-trivinyldisilane. I.e., $[(CH_3CH_2)_2N—](H_2C=C(H)—)_2SiSiCl_2[—N(CH_2CH_3)_2]$; $[((CH_3)_2CH)_2N—]SiCl_2SiCl_2(—(H)C=CH_2)$; $[((CH_3)_2CH)_2N—]SiCl_2SiCl(—(H)C=CH_2)_2$; and $[((CH_3)_2CH)_2N—]SiCl_2SiCl_2(—(H)C=CH_2)$; $[((CH_3)_2CH)_2N—]SiCl_2Si(—(H)C=CH_2)_3$; respectively.

Aspect 14. A method of making a SiH-free vinyldisilane compound independently consisting of 6 silicon-bonded substituents selected from 1 to 5 silicon-bonded vinyl groups and 5 to 1 silicon-bonded substituents, respectively, independently selected from silicon-bonded chlorine atoms and silicon-bonded dialkylamino groups; with the proviso that when there is only 1 silicon-bonded vinyl group, there is at least 1 silicon-bonded dialkylamino group, the method comprising contacting a SiH-free chlorodisilane compound independently consisting of 6 silicon-bonded substituents selected from 1 to 6 silicon-bonded chlorine atoms and 5 to 0 silicon-bonded dialkylamino groups with from 1 to 5 mole equivalents of a vinylmagnesium chloride or with from 0.5 to 2.5 mole equivalents of divinylmagnesium to give a reaction product comprising the SiH-free vinyldisilane compound. The term "SiH-free chlorodisilane compound" means a molecule consisting of two silicon atoms and six silicon-bonded substituents, at least one of which is a silicon-bonded chlorine atom; or a collection of such molecules, which are independently the same or different.

Aspect 15. The method of aspect 14, wherein the SiH-free chlorodisilane compound is 1,1,1,2,2,2-hexachlorodisilane and the SiH-free vinyldisilane is of any one of aspects 2 to 4. By adjusting the molar ratio of moles of the vinylmagnesium chloride or divinylmagnesium to moles of the 1,1,1,2,2,2-hexachlorodisilane, the method of this aspect may be advantageously used to synthesize a variety of regioisomers of the per(chloro,vinyl)disilane compound. Different mixtures of two or more regioisomers may be prepared, which mixtures may then be subjected to fractional distillation or gas chromatography so as to separate the regioisomers from each other to give different purified per(chloro,vinyl)disilane compounds. For illustration, contacting 1,1,1,2,2,2-hexachlorodisilane with 0.2 mole equivalent of vinylmagnesium chloride or 0.1 mole equivalent of divinylmagnesium may give a mixture mainly of 1,1,1,2,2-pentachloro-2-vinyldisilane; 1,1-divinyl-1,2,2,2-tetrachlorodisilane; and 1,2-divinyl-1,1,2,2-tetrachorodisilane. Alternatively, contacting 1,1,1,2,2,2-hexachlorodisilane with an excess number of mole equivalents of vinylmagnesium chloride or half of the foregoing excess number of mole equivalents of divinylmagnesium may give a mixture mainly of 1,1,1,2,2,2-hexavinyldisilane; 1-chloro-1,1,2,2,2-pentavinyldisilane; 1,1-dichloro-1,2,2,2-tetravinyldisilane; 1,2-dichloro-1,1,2,2-tetravinyldisilane; and 1,1,1,2,2,2-hexavinyldisilane. Alternatively, using 3 mole equivalents of vinylmagnesium chloride or 1.5 mole equivalents of divinylmagnesium may give a mixture mainly of 1,1-divinyl-1,2,2,2-tetrachlorodisilane; 1,2-divinyl-1,1,2,2-tetrachorodisilane; 1,1,1-trichloro-2,2,2-trivinyldisilane; 1,1,2-trichloro-1,2,2-trivinyldisilane; 1,1-dichloro-1,2,2,2-tetravinyldisilane; and 1,2-dichloro-1,1,2,2-tetravinyldisilane. Separating the regioisomers from each of the mixtures from each other gives a plurality of purified per(chloro,vinyl)disilane compounds selected from: 1,1,1,2,2-pentachloro-2-vinyldisilane; 1,1-divinyl-1,2,2,2-tetrachlorodisilane; 1,2-divinyl-1,1,2,2-tetrachorodisilane; 1,1,1-trichloro-2,2,2-trivinyldisilane; 1,1,2-trichloro-1,2,2-trivinyldisilane; 1,1-dichloro-1,2,2,2-tetravinyldisilane; 1,2-dichloro-1,1,2,2-tetravinyldisilane; 1-chloro-1,1,2,2,2-pentavinyldisilane; and 1,1,1,2,2,2-hexavinyldisilane.

Aspect 16. The method of aspect 14, wherein the SiH-free chlorodisilane compound is a per(dialkylamino,chloro)disilane and the SiH-free vinyldisilane is of any one of aspects 5 to 13. In some aspects the per(dialkylamino,chloro)disilane is 1-dialkylamino-1,1,2,2,2-pentachlorodisilane or a 1,2-bis(dialkylamino)-1,1,2,2-tetrachlorodisilane.

Typically, the reactions using vinylmagnesium chloride or divinylmagnesium are run in an anhydrous, unsubstituted dialkyl ether solvent such as diethyl ether. Unsubstituted cyclic ethers such as anhydrous tetrahydrofuran (THF) or 1,4-dioxane are disfavored because it is believed that they may undesirably react with 1,1,1,2,2,2-hexachlorodisilane. Commercially available Grignard solutions in unsubstituted cyclic ethers may be solvent exchanged into the unsubstituted dialkyl ether by any suitable means. For example, a THF-containing solution of vinylmagnesium chloride may be dried in vacuo to give a residue consisting essentially of the vinylmagnesium chloride and being free of (lacking) THF, and then dissolving or suspending the residue in anhydrous diethyl ether to give a THF-free solution or slurry of vinylmagnesium chloride in diethyl ether. Typically, the reactions using vinylmagnesium chloride or divinylmagnesium are conducted at a reaction temperature of from −80° to +10° C. The reactions may be performed in an inert atmosphere such as anhydrous molecular nitrogen gas, anhydrous helium, or anhydrous argon.

Aspect 17. The method of aspect 16, wherein in a subsequent step each silicon-bonded dialkylamino group of the SiH-free vinyldisilane is converted to a silicon-bonded chlorine atom by contacting the SiH-free vinyldisilane having the silicon-bonded dialkylamino group(s) with two mole equivalents of hydrogen chloride per mole equivalent of silicon-bonded dialkylamino group(s) to give a corresponding per(chloro,vinyl)disilane. The corresponding per(chloro,vinyl)disilane made here may be of any one of aspects 2 to 4. The method of this aspect may be advantageously used to synthesize unsymmetrical per(chloro,vinyl)disilane and per(chloro,dialkylamino,vinyl)disilane compounds having 1 to 3 vinyl groups on one silicon atom and no vinyl groups on the other silicon atom of the per(chloro,vinyl)disilane or per(chloro,dialkylamino,vinyl)disilane. For illustration, contacting 1-di(1-methylethyl)amino-1,1,2,2,2-pentachlorodisilane with 3 mole equivalents of vinylmagnesium chloride gives 1-di(1-methylethyl)amino-1,1-dichloro-2,2,2-trivinyldisilane: $Cl_3SiSiCl_2N(CH(CH_3)_2)_2 + 3H_2C=CHMgCl \rightarrow (H_2C=CH)_3SiSiCl_2N(CH(CH_3)_2)_2$. If desired, contacting the 1-di(1-methylethyl)amino-1,1-dichloro-2,2,2-trivinyldisilane with two mole equivalents of hydrogen chloride cleanly gives 1,1,1-trichloro-2,2,2-trivinyldisilane: $(H_2C=CH)_3SiSiCl_2N(CH(CH_3)_2)_2 + 2HCl \rightarrow (H_2C=CH)_3SiSiCl_3$.

Typically, the reactions using hydrogen chloride are conducted in an unsubstituted hydrocarbon solvent such as an alkanes or isoalkanes mixture. The reactions are usually conducted at a reaction temperature of from −80° to +10° C. The reactions may be performed in an inert atmosphere such as anhydrous molecular nitrogen gas, anhydrous helium, or anhydrous argon.

Aspect 18. The method of any one of aspects 14 to 17 further comprising purifying the SiH-free vinyldisilane that is made to give a bulk form thereof containing from 70 to 100 area percent (Gas Chromatography) ("area % (GC)") thereof. The purifications of intermediates and products may be done by any convenient means such as gas chromatography or fractional distillation. The purifications may be performed under vacuum (e.g., in vacuo) or in an inert atmosphere such as anhydrous molecular nitrogen gas, anhydrous helium, or anhydrous argon.

Aspect 19. A method of treating an initial surface of a substrate, the method comprising a first contacting step comprising contacting the initial surface of the substrate with a vapor of a SiH-free vinyldisilane compound selected from hexavinyldisilane, 1,1,1,2,2-pentachloro-2-vinyldisilane, or the SiH-free vinyldisilane compound of any one of aspects 1-13, using a first deposition method to give a product comprising a treated surface on the substrate. Prior to the first contacting step the initial surface of the substrate is ready to receive the silicon-heteroatom compound and may be in need of a dielectric, barrier or stressor layer. The initial surface of the substrate is different than the treated surface of the substrate in at least one of composition, reactivity, or functionality.

Aspect 20. A method of making a silicon-heteroatom compound, the method comprising a first contacting step comprising contacting the initial surface of the substrate with a vapor of a SiH-free vinyldisilane compound selected from hexavinyldisilane, 1,1,1,2,2-pentachloro-2-vinyldisilane, or the SiH-free vinyldisilane compound of any one of aspects 1-13, using a first deposition method to give a treated surface on the substrate; and a second contacting step comprising contacting the initial surface or the treated surface of the substrate with a vapor or plasma of a precursor material containing nitrogen atom(s), oxygen atom(s), carbon atom(s), or a combination of any two or more atoms thereof using a second deposition method to give a product comprising a silicon-heteroatom compound formed with or on the initial or treated surface of the substrate. Prior to the first contacting step the initial surface of the substrate is ready to receive the silicon-heteroatom compound and may be in need of a dielectric, barrier or stressor layer. The initial surface of the substrate is different than the treated surface of the substrate in at least one of composition, reactivity, or functionality. The first deposition method may be the same as or different than the second deposition method. One or both of the first and second deposition methods may be film-forming methods. The composition of the silicon-heteroatom compound is different than the compositions of the treated surface of the substrate and the initial surface of the substrate. The silicon-heteroatom compound may be made as a film, a particulate solid, or a designed structure on the initial surface of the substrate.

In the method of aspect 19 or 20, the SiH-free vinyldisilane compound is a molecule or a collection of molecules wherein each molecule is independently the same or different than another molecule. In some embodiments of the SiH-free vinyldisilane compound is hexavinyldisilane, alternatively 1,1,1,2,2-pentachloro-2-vinyldisilane, alternatively the SiH-free vinyldisilane compound of any one of aspects 1-13.

Aspect 21. The method of aspect 20 wherein the precursor material containing nitrogen atom(s) is molecular nitrogen, ammonia, hydrazine, an organohydrazine, hydrogen azide, a primary amine, or a secondary amine; the precursor material containing oxygen atom(s) is molecular oxygen, ozone, water, nitrous oxide ($N_2O$), or hydrogen peroxide; and the precursor material containing carbon atom(s) is methane, ethane, propane, a butane, a chloromethylsilane, a permethylsilane having from 1 to 5 Si atoms, or a methylhydridosilane having 1 to 5 Si atoms.

Aspect 22. The method of aspect 20 or 21 wherein the precursor material further contains silicon atom(s), hydrogen atom(s), chlorine atom(s), or a combination of any two or more atoms thereof.

Aspect 23. The method of any one of aspects 20 to 22 wherein (i) the first contacting step is completed before the second contacting step is performed such that the second contacting step comprises contacting the treated surface of the substrate with the vapor or plasma of a precursor material; or (ii) the method comprises atomic layer deposition; or (iii) both (i) and (ii). In some aspects, the method is (i), alternatively (ii), alternatively (iii). The atomic layer deposition may be plasma-enhanced.

Aspect 24. The method of any one of aspects 20 to 22 wherein (i) the first and second contacting steps are performed simultaneously such that the second contacting step comprises contacting the initial surface of the substrate with the vapor or plasma of a precursor material; or (ii) the method comprises chemical vapor deposition; or (iii) both (i) and (ii). In some aspects, the method is (i), alternatively (ii), alternatively (iii). The chemical vapor deposition may be plasma-enhanced.

Aspect 25. The method of any one of aspects 20 to 24 wherein (i) the silicon-heteroatom compound that is made is a silicon carbide, a silicon nitride, a silicon dioxide, a silicon oxynitride, a silicon carbonitride, a silicon oxycarbide, or a silicon oxycarbonitride; or (ii) the silicon-heteroatom compound is made in the shape of a film on the initial surface of substrate; or (iii) both (i) and (ii).

Aspect 26. The method of any one of aspects 20 to 25 further comprising a step of separating the silicon-heteroatom compound of the product from the substrate of the product so as to give the separated silicon-heteroatom compound as a free-standing bulk form.

Aspect 27. The silicon-heteroatom compound made by the method of any one of aspects 20 to 26.

Aspect 28. A manufactured article comprising the product made by the method of any one of aspects 19 to 26 or the silicon-heteroatom compound of aspect 27. The manufactured article may be an electronic device or a microelectromechanical system (MEMS), wherein the product is a component of the electronic device or MEMS.

In some aspects each silicon-bonded dialkylamino group described herein is independently of formula $(R^N)_2N-$, wherein each $R^N$ independently is $(C_1-C_4)$alkyl, alternatively $(C_1-C_3)$alkyl, alternatively $(C_2-C_4)$alkyl, alternatively $(C_2-C_3)$alkyl, alternatively methyl, alternatively ethyl, alternatively $(C_3)$alkyl, alternatively $(C_4)$alkyl.

We present technical solutions to several problems. One technical solution is a precursor, the SiH-free vinyldisilane compound of any one of aspects 1-13, for forming silicon-heteroatom compounds.

Another technical solution is a method of treating a surface of a substrate. The surface of the substrate is in need of treatment.

Another technical solution is a method of forming silicon-heteroatom compound, the new method comprising using as a precursor the SiH-free vinyldisilane compound of any one of aspects 1-13.

Another technical solution is a way to lower the deposition temperature below 600° C.

The per(dialkylamino,chloro)disilane such as the 1-dialkylamino-1,1,2,2,2-pentachlorodisilane or the 1,2-bis(dialkylamino)-1,1,2,2-tetrachlorodisilane, may be synthesized by any suitable method comprising reacting a source of the dialkylamino group(s) with hexachlorodisilane ($Cl_3SiSiCl_3$, also written as $ClSiCl_2SiCl_3$). For illustration, the 1-dialkylamino-1,1,2,2,2-pentachlorodisilane may be synthesized by a reaction shown here: dialkylamine (e.g., $[(CH_3)_2CH]_2NH$+ $Cl_3SiSiCl_3 \rightarrow [(CH_3)_2CH]_2NSiCl_2SiCl_3$+"HCl," wherein the "HCl" indicates a formal reaction by-product, which in usual practice reacts with an acid scavenger, as described below, to give a salt. When the dialkylamino group is di(1-methylethyl)amino, also known as diisopropylamino, an example of the formal process is: $2[(CH_3)_2CH]_2NH$+ $Cl_3SiSiCl_3 \rightarrow [(CH_3)_2CH]_2NSiCl_2SiCl_3$+$[(CH_3)_2CH]_2NH_2Cl$. The $[(CH_3)_2CH]_2NH_2Cl$ salt may precipitate in the reaction and may be separated therefrom such as via filtration or decantation. The process may comprise contacting, in a hydrocarbon vehicle, hexachlorodisilane with a source of dialkylamino group to give the 1-dialkylamino-1,1,2,2,2-pentachlorodisilane; wherein the source of dialkylamino group is, relative to the hexachlorodisilane, from 0.50 to 1.19 molar equivalents of a metal dialkylamide, [e.g., $(i\text{-}Pr)_2N]_mM^A$, wherein subscript m is 1 or 2, wherein when m is 1, $M^A$ is an element of Group I of the Periodic Table of the Elements and when m is 2, $M^A$ is an element of Group II of the Periodic Table of the Elements], or the source of dialkylamino group is from 1.0 to 2.39 molar equivalents of dialkylamine (e.g., $[(CH_3)_2CH]_2NH$), or the source of dialkylamino group is a mixture of from 0.50 to 1.19 molar equivalents of dialkylamine (e.g., $[(CH_3)_2CH]_2NH$) and from 0.50 to 1.19 molar equivalents of a pyridine compound or a trialkylamine ($Alkyl_3N$), wherein each alkyl independently is a ($C_2$-$C_{10}$)alkyl. Examples of the pyridine compound are pyridine and 2,6-dimethylpyridine.

For further illustration, the 1,2-bis(dialkylamino)-1,1,2,2-tetrachlorodisilane, wherein each dialkylamino group is the same, may be synthesized in a manner analogous to that described for the synthesis of the 1-dialkylamino-1,1,2,2,2-pentachlorodisilane except wherein the molar ratio of the source of the dialkylamino group to hexachlorodisilane is doubled. For example, the source of dialkylamino group is, relative to the hexachlorodisilane, from 1.00 to 2.38 molar equivalents of a metal dialkylamide, [e.g., $(Et)_2N]_mM^A$, wherein subscript m is 1 or 2, wherein when m is 1, $M^A$ is an element of Group I of the Periodic Table of the Elements and when m is 2, $M^A$ is an element of Group II of the Periodic Table of the Elements], or the source of dialkylamino group is from 2.0 to 4.78 molar equivalents of dialkylamine (e.g., $(CH_3CH_2)_2NH$), or the source of dialkylamino group is a mixture of from 1.00 to 2.38 molar equivalents of dialkylamine (e.g., $(CH_3CH_2)_2NH$) and from 1.00 to 2.38 molar equivalents of a pyridine compound or a trialkylamine ($Alkyl_3N$), wherein each alkyl independently is a ($C_2$-$C_{10}$)alkyl.

For further illustration, the 1,2-bis(dialkylamino)-1,1,2,2-tetrachlorodisilane, wherein the dialkylamino groups are different, may be synthesized in a similar manner by first synthesizing 1-dialkylamino-1,1,2,2,2-pentachlorodisilane from a source of a first dialkylamino group (e.g., from 1.0 to 2.39 molar equivalents of $[(CH_3)_2CH]_2NH$) to give an intermediate which is the 1-dialkylamino-1,1,2,2,2-pentachlorodisilane (e.g., 1-di(1-methylethylamino)-1,1,2,2,2-pentachlorodisilane). Then contact the intermediate with a source of a second dialkylamino group (e.g., diethylamino), which is different than the first dialkylamino group) to give the 1,2-bis(dialkylamino)-1,1,2,2-tetrachlorodisilane, wherein the dialkylamino groups are different, (e.g., 1-diethylamino-2-di(1-methylethyl)amino-1,1,2,2-tetrachlorodisilane).

The process of synthesizing the per(dialkylamino,chloro)disilane may be carried out in a hydrocarbon vehicle or an ether vehicle. The ether vehicle may comprise a disilyl ether, a dihydrocarbyl ether, or an alkylene glycol dialkyl ether, or a mixture of any two or more thereof. The dihydrocarbyl ether may be a straight chain ether, a cyclic ether, or a diaryl ether, or a mixture of any two or more thereof. Examples of the ether vehicle are diethyl ether, dimethyl ether, tetrahydrofuran, 1,2-dimethoxyethane, tetraethylene glycol dimethyl ether. The alkylene glycol dialkyl ether may be a tetramethylene glycol di($C_1$-$C_4$)alkyl ether, a propylene glycol di($C_2$-$C_4$)alkyl ether, an ethylene glycol di($C_3$ or $C_4$)alkyl ether, or a mixture of any two or more thereof. The hydrocarbon vehicle may comprise an alkane having at least 5 carbon atoms, a cycloalkane having at least 5 carbon atoms, an arene having at least 6 carbon atoms, or a mixture of any two or more thereof. The hydrocarbon vehicle may comprise a pentane, hexane, hexanes, cyclohexane, a heptane, benzene, toluene, a xylene, or a mixture of any two or more thereof.

The composition of the hydrocarbon vehicle may be conceived to optimize the contacting steps (e.g., selecting a hydrocarbon vehicle having a boiling point for achieving a desired reaction temperature or a hydrocarbon vehicle lacking ability to solubilize a reaction by-product such that the latter can be precipitated). Additionally or alternatively, the composition of the hydrocarbon vehicle may be conceived to optimize an optional separating step (e.g., selecting a hydrocarbon vehicle having a desired boiling point enabling evaporation thereof without evaporating the per(dialkylamino,chloro)disilane). The hydrocarbon vehicle may consist of carbon and hydrogen atoms or may be a halogenated hydrocarbon vehicle consisting of carbon, hydrogen, and halogen atoms. The hydrocarbon vehicle consisting of C and H atoms may be alkanes, aromatic hydrocarbons, and mixtures of any two or more thereof. The alkanes may be hexanes, cyclohexane, heptanes, isoparaffins, or mixtures of any two or more thereof. The aromatic hydrocarbon may be toluene, xylenes, or mixtures of any two or more thereof. The halogenated hydrocarbon vehicle may be dichloromethane or chlorobenzene. The process having different compositions for hydrocarbon vehicle may differ from each other in at least one result, property, function, and/or use. Different compositions of the hydrocarbon vehicle may provide different solubilities for the per(dialkylamino,chloro)disilane, the source(s) of the dialkylamino group(s), a reaction by-product, or a combination of any two or more thereof.

Hexachlorodisilane may be used as the starting material to synthesize any embodiment of the SiH-free vinyldisilane according to the synthetic methods described herein. Hexachlorodisilane may be purchased from a commercial source such as Dow Corning Corporation, a wholly-owned subsidiary of The Dow Chemical Company, or may be synthesized by any suitable method.

The SiH-free vinyldisilane compound as prepared in bulk form may be of sufficient purity to be used in the method of making the silicon-heteroatom compound. In some embodiments the bulk form of the SiH-free vinyldisilane compound as prepared may be in need of purification. The synthesis of the SiH-free vinyldisilane compound may further comprise purifying the bulk form of same such as by fractional distillation or gas chromatography.

Purity of the bulk form of the SiH-free vinyldisilane compound and other precursor materials may be determined by $^{29}$Si-NMR, reverse phase liquid chromatography or, more likely, by gas chromatography (GC) as described later. For example, the purity determined by GC may be from 60 area % to ≤100 area % (GC), alternatively from 70 area % to ≤100 area % (GC), alternatively from 80 area % to ≤100 area % (GC), alternatively from 90 area % to ≤100 area % (GC), alternatively from 93 area % to ≤100 area % (GC), alternatively from 95 area % to ≤100 area % (GC), alternatively from 97 area % to ≤100 area % (GC), alternatively from 99.0 area % to ≤100 area % (GC). Each ≤100 area % (GC) independently may be as defined previously.

The silicon-heteroatom compound consists of silicon and at least one heteroatom selected from carbon, nitrogen and oxygen. The silicon-heteroatom compound may consist of silicon carbide (Si and C atoms), silicon nitride (Si and N atoms), silicon dioxide (Si and O atoms), silicon carbonitride (Si, C and N atoms), silicon oxycarbide (Si, C and O atoms), silicon oxycarbonitride (Si, C, N and O atoms), or silicon oxynitride (Si, N and O atoms). A bulk form of the silicon-heteroatom compound (a collection of two or more molecules) may be free of additional elements or, optionally, may further contain one or more dopants and/or one or more impurities. Dopants are elements other than Si, C, N, and O that are intentionally added to the bulk form in measured amounts to enhance the properties of the bulk material in a particular application. An impurity is an element other than Si, C, N, and O and dopants that contaminates the bulk form, wherein the lower the concentration of impurity element(s) the better. Ideally the bulk form of the silicon-heteroatom compound is free of impurities (i.e., 0% concentration of impurity element(s)).

The method of making the silicon-heteroatom compound comprises the first and second deposition methods. The deposition methods that may be used herein are not particularly limited and include any of the well-known deposition techniques, deposition apparatuses, and associated operating conditions for manipulating precursor materials for depositing a silicon-heteroatom compound onto a substrate. Deposition techniques, apparatuses and their associated operating conditions that are suitable for use in the method of making the silicon-heteroatom compound are generally well-known in the art. The deposition methods generally involve placing a substrate in a reaction chamber of a deposition apparatus; evacuating the reaction chamber housing the substrate; heating the substrate in the reaction chamber; generating one or more precursors outside the reaction chamber; feeding the precursor(s) into the reaction chamber, wherein when two or more precursors are used the feeding thereof may be sequentially or simultaneously; and either allowing the precursor(s) to be absorbed onto the surface of the heated substrate, where they may decompose to form the silicon-heteroatom compound, or to react chemically to give the silicon-heteroatom compound in the vaporous form, which is subsequently absorbed onto the surface of the heated substrate, stopping the feeding of the precursor(s), cooling the substrate and removing it from the reaction chamber to give the product.

In certain embodiments each deposition method independently comprises physical vapor deposition, atomic layer deposition (ALD), or chemical vapor deposition (CVD). The physical vapor deposition method may comprise sputtering. Suitable sputtering methods include direct current (DC) magnetron sputtering, ion-beam sputtering, reactive sputtering, and ion-assisted sputtering. Typically, the deposition method comprises ALD or CVD.

Suitable ALD methods include plasma enhanced atomic layer deposition methods (PEALD), spatial atomic layer deposition (SALD) and thermal atomic layer deposition (TALD) methods. When PEALD methods are employed, the plasma may be any one of the foregoing plasmas. The plasma may optionally further contain a carrier gas such as molecular nitrogen or argon gas. Plasmas are formed from plasma-forming gases, which may comprise a mixture of molecular nitrogen and molecular hydrogen.

Suitable CVD methods include simple thermal vapor deposition, plasma enhanced chemical vapor deposition (PECVD), electron cyclotron resonance (ECRCVD), atmospheric pressure chemical vapor deposition (APCVD), low pressure chemical vapor deposition (LPCVD), ultrahigh vacuum chemical vapor deposition (UHVCVD), aerosol-assisted chemical vapor deposition (AACVD), direct liquid injection chemical vapor deposition (DLICVD), microwave plasma-assisted chemical vapor deposition (MPCVD), remote plasma-enhanced chemical vapor deposition (RPECVD), atomic layer chemical vapor deposition (ALCVD), hot wire chemical vapor deposition (HWCVD), hybrid physical-chemical vapor deposition (HPCVD), rapid thermal chemical vapor deposition (RTCVD), and vapor-phase epitaxy chemical vapor deposition (VPECVD), photo-assisted chemical vapor disposition (PACVD), and flame assisted chemical vapor deposition (FACVD).

The CVD method may be conducted using a CVD apparatus that is a flowable chemical vapor apparatus, a thermal chemical vapor deposition apparatus, a plasma enhanced chemical vapor deposition apparatus, a photochemical vapor deposition apparatus, an electron cyclotron resonance apparatus, an inductively coupled plasma apparatus, a magnetically confined plasma apparatus, a low pressure chemical vapor deposition apparatus, or a jet vapor deposition apparatus. In certain embodiments the CVD technique and apparatus comprises plasma enhanced chemical vapor deposition, alternatively low pressure chemical vapor deposition. A suitable CVD technique and apparatus are Cyclic CVD and a Cyclic CVD apparatus.

The reaction chamber of the sputtering, ALD, or CVD deposition apparatus is a volumetrically enclosed space. The reaction chamber may host the operating conditions and house the substrate on which the silicon-heteroatom compound is to be formed. During the deposition method, the SiH-free vinyldisilane compound, precursor material and any other deposition materials (e.g., inert gas or reactive species) are fed into the reaction chamber. The feeding may be sequential or simultaneous. In the reaction chamber, vapors, gases or plasmas for forming the film of the silicon-heteroatom compound may be mixed and reacted. The reaction forms the proper film elements or molecules in a vapor state. The elements or molecules then deposit on the substrate (e.g., a semiconductor wafer) and build up to form the film. All other things being equal, the longer the elements or molecules are allowed to build up, the greater the thickness of the film.

Techniques, apparatuses and operating conditions for the method of making the silicon-heteroatom compound and obtaining different film thicknesses may be optimized. Optimization may be based on considerations such as the particular SiH-free vinyldisilane compound and/or precursor material and any other materials used in the method, the particular composition of the silicon-heteroatom compound made, the desired purity of the silicon-heteroatom compound, the geometric configuration of the substrate, the device or application for which the silicon-heteroatom compound is intended to be incorporated or used, and economic (cost) considerations. Additional considerations are temperature of and pressure in the reaction chamber, concentration in the gas phase of the SiH-free vinyldisilane compound, any additional reactant gas concentration (e.g., concentration of gas of any carbon precursor material, nitrogen precursor material, and/or oxygen precursor material), total gas flow, substrate temperature, and stability of the substrate. The oxygen precursor material, ozone, may be delivered at a concentration in air of from >0 volume/volume percent (v/v %) to 5 v/v % or at a concentration in molecular oxygen of from >0 v/v % to 14 v/v %. Whether optimized or not, the operating conditions lead to formation of the silicon-heteroatom compound by producing in the reaction chamber a chemical reaction such as pyrolysis, oxidation, reduction, hydrolysis, aminolysis (e.g., amination), carbonization, or a combination of any two or more thereof of the SiH-free vinyldisilane compound and any other precursor material.

The deposition methods generally require adding energy to the reaction chamber, such as evacuating the reaction chamber and heating the reaction chamber and substrate housed therein prior to the feeding of the SiH-free vinyldisilane compound, precursor material and any other deposition materials thereinto. The deposition method may be conducted at less than atmospheric pressure such as a pressure from 1 to 13,000 pascals (Pa), alternatively 1 to 1,300 Pa, alternatively 10 to 1,300 Pa, alternatively 130 to 1,300 Pa. The temperature at which the deposition method is carried out may be isothermal or dynamic. Conventional deposition methods (not using the SiH-free vinyldisilane compound) generally require significantly higher deposition temperatures, such as greater than 600° C., e.g. 600° to 1000° C. However, it is believed that the SiH-free vinyldisilane compound may be utilized in the deposition method at much lower temperatures, e.g., from 100° to 700° C., alternatively from 200° to 700° C., alternatively from 200° to <600° C., alternatively from 200° to 500° C., alternatively from 200° to 400° C., alternatively from 100° to 300° C.

Some embodiments of the method of making the silicon-heteroatom compound may further include a reactive environment comprising nitrous oxide ($N_2O$). In these embodiments the method generally involves decomposing the SiH-free vinyldisilane compound in the presence of nitrous oxide. Such a method is generally described in U.S. Pat. No. 5,310,583. The nitrous oxide may modify the composition of the silicon-heteroatom compound made by the embodiments relative to embodiments of the method that do not include nitrous oxide.

Some aspects of the method of making the silicon-heteroatom compound may further include an inert gas, which may be used in combination with the SiH-free vinyldisilane compound and/or with any one of the foregoing precursor materials. Examples of the inert gas are helium, argon, and mixtures thereof. For example, helium may be used in combination with the SiH-free vinyldisilane compound and/or any one of the carbon-containing precursor, nitrogen-containing precursor and oxygen-containing precursor in an embodiment of the method wherein the silicon-heteroatom compound that is formed is a silicon carbon compound, silicon nitrogen compound, or silicon oxygen compound, respectively.

A substrate is typically used in the method to provide a place where the silicon-heteroatom compound may be synthesized or deposited after its synthesis. The substrate is not particularly limited in composition or shape. In certain embodiments the substrate has sufficient thermal and/or chemical stability under the operating conditions such as the temperature and the reactive environment in the reaction chamber of the deposition apparatus. A suitable substrate may be composed of silicate glass, metal, plastic, ceramic, or a semiconductor material. The semiconductor material may be elemental silicon (e.g., monocrystalline silicon, polycrystalline silicon, or amorphous silicon). The surface of the substrate on which the silicon-heteroatom compound is to be deposited may be flat (planar) or patterned. The patterned surface may have features with an aspect ratio ranging from 1 to 500, alternatively from 1 to 50, alternatively from 10 to 50. The deposition method may form films that conformally coat the flat or patterned surface of the substrate. The pattern of the patterned surface of the substrate may be designed in such a way that the film of the silicon-heteroatom compound formed thereon has a designed complementary shape.

The deposition method typically forms the silicon-heteroatom compound as a film. The film is restricted in one dimension, which may be referred to as thickness. The film may be an amorphous or crystalline material. The film may be epitaxial. The film of the silicon-heteroatom compound may be a silicon carbon film, a silicon nitrogen film, or a silicon oxygen film. (e.g., silicon nitride, silicon carbonitride, silicon oxynitride, or silicon oxycarbonitride film, alternatively a silicon nitrogen film or a silicon oxygen film (e.g., silicon nitride, silicon oxide). The silicon carbon film formed by the method contains Si and C atoms and optionally N and/or O atoms. The silicon nitrogen film formed by the method contains Si and N atoms and optionally C and/or O atoms. The silicon oxygen film formed by the method contains Si and O atoms and optionally C and/or N atoms. In some aspects the film is disposed on a silicon wafer. In some aspects the silicon-heteroatom compound is a silicon nitride, alternatively a silicon carbide, alternatively a silicon dioxide, alternatively a silicon oxynitride, alternatively a silicon carbonitride, alternatively a silicon oxycarbide, alternatively a silicon oxycarbonitride.

Films of the silicon-heteroatom compound having different thicknesses may be formed using different deposition methods or operating conditions. The particular deposition method and operating conditions may impact the structure and properties of the film. Generally, it is possible to control the orientation of film structure, the manner in which the film coalesces, the uniformity of the film, and crystalline/non-crystalline structure of the film. The thickness of a particular film may be uniform, and different films having different thicknesses may be made for different intended end uses of the films. For instance, an embodiment of the film of the silicon-heteroatom compound may have a thickness of a few nanometers, whereas another embodiment may have a thickness of a few microns, and still another embodiment may have a greater or lesser thickness or a thickness falling in-between. In some embodiments the film has a thickness of from 0.01 to 1,000 nanometers (nm), alternatively 0.1 to 100 nm, alternatively 1 to 100 nm.

Once formed, the silicon-heteroatom compound (e.g., film thereof) may be used as is, i.e., in an uncovered state. The film may be used while it is disposed on the substrate, or the film may be separated from the substrate before it is used.

Alternatively, the silicon-heteroatom compound (e.g., film thereof) optionally may be covered by one or more top coatings. Each top coating may be independently composed of an embodiment of the silicon-heteroatom compound or a different material and independently may be formed by the method of making the silicon-heteroatom compound or by a different (non-invention) method. The non-invention method may use a precursor material other than the SiH-free vinyldisilane compound. Examples of a top coating that may cover the (film of the) silicon-heteroatom compound are a $SiO_2$ coating, a $SiO_2$/modifying ceramic oxide layer, a silicon-containing coating, a silicon carbon-containing coating, a silicon carbide-containing coating, a silicon nitrogen-containing coating, a silicon nitride-containing coating, a silicon nitrogen carbon-containing coating, a silicon oxygen nitrogen containing coating, and a diamond-like carbon coating. Such top coatings and suitable methods of making are generally known in the art.

Because the SiH-free vinyldisilane compound contains two Si—N bonds, in some embodiments the SiH-free vinyldisilane compound may be utilized to form silicon nitride films without use of the nitrogen-containing precursor. Alternatively, the nitrogen-containing precursor may be also used, if desired.

The silicon-heteroatom compound may be useful in electronics and photovoltaic devices and applications. Such uses include the silicon-heteroatom compound in the shape of the film, a plurality of particles, or a designed structure; whether the compound is disposed on the substrate or is free-standing; and whether the compound is an uncovered state or is top covered as described above. The silicon-heteroatom compound may be used as a dielectric, barrier, or stressor material. Silicon nitride film embodiments of the silicon-heteroatom compound may be act as an insulator layer, passivation layer, or a dielectric layer between polysilicon layers in capacitors.

In addition, operating conditions of the deposition method may be adjusted to control whether the method forms an elemental Si film or a silicon-heteroatom compound such as a SiN film. In an additional aspect, the invention further includes a method of forming an elemental silicon film that is free of heteroatoms N, C, and O, the method comprising the first contact step of aspect 3.

This description has been intentionally written such that any one stated feature or limitation of an example, any one stated Markush subgenus or species, or any one stated number of a range or subrange, may be relied upon and provides adequate support for amending the claims.

Unless otherwise defined herein, meanings of chemical technology terms used herein may be found in IUPAC. Compendium of Chemical Terminology, 2nd ed. (the "Gold Book"). Compiled by A. D. McNaught and A. Wilkinson. Blackwell Scientific Publications, Oxford (1997). XML on-line corrected version: http://goldbook.iupac.org (2006-) created by M. Nic, J. Jirat, B. Kosata; updates compiled by A. Jenkins. ISBN 0-9678550-9-8. doi: 10.1351/goldbook. Hawley's CONDENSED CHEMICAL DICTIONARY, 11$^{th}$ edition, N. Irving Sax & Richard J. Lewis, Sr., 1987 (Van Nostrand Reinhold) may have terms not defined by IUPAC.

Unless otherwise defined herein, meanings of general terms used herein may be found here. Alternatively precedes a distinct embodiment. Articles "a", "an", and "the" each refer to one or more. Chemical element or atom, a Group or Groups of chemical elements shall mean those published by IUPAC in the Periodic Table of the Elements, version dated 1 May 2013. Any comparative example is used for illustration purposes only and shall not mean prior art. A synthesized product may have a structure that can be varied depending upon the particular reactants and synthesis conditions used to make it. That variability is not unlimited, but is restricted according to the structure of the reactants and synthesis chemistry and conditions. Free of or lacks means a complete absence of; alternatively not detectable, e.g., using nuclear magnetic resonance (NMR) spectroscopy (e.g., $^1$H-NMR, $^{13}$C-NMR, or $^{29}$Si-NMR) or Fourier Transform-Infrared (FT-IR) spectroscopy. Invention and inventive shall mean an embodiment, and shall not be interpreted as constituting the entire invention. IUPAC is International Union of Pure and Applied Chemistry (IUPAC Secretariat, Research Triangle Park, N.C., USA). Markush group comprises a genus of two or more members. A Markush group of members A and B may be equivalently expressed as: "a member selected from A and B"; "a member selected from the group consisting of A and B"; or "a member A or B". Each member may independently be a subgenus or species of the genus. May confers a permitted choice, not an imperative. Operative means functionally capable or effective. Optional(ly) means is absent (or excluded), alternatively is present (or included). Properties are measured using a standard test method and conditions for the measuring. Ranges of numbers include endpoints, subranges, and whole and/or fractional values subsumed therein, except a range of integers does not include fractional values. Removing a component from a mixture of components does not include selectively derivatizing/reacting the component to form a derivative/product unless the derivative/product is physically separated from the other components of the mixture. Vehicle means a liquid acting as a carrier, dispersant, diluent, storage medium, supernatant, or solvent for another material, which may or may not be soluble therein.

Any compound herein includes all its isotopic forms, including natural abundance forms and isotopically-enriched forms. In some aspects, the isotopic form is the natural abundance form, alternatively the isotopically-enriched form. The isotopically-enriched forms may have additional uses, such as medical or anti-counterfeiting applications, wherein detection of the isotopically-enriched compound is helpful in treatment or detection.

In some aspects any composition described herein may contain any one or more of the chemical elements of Groups 1 to 18 of the Periodic Table of the Elements. In some aspects at least one such chemical element is specifically excluded from the composition, except not excluded are Si, O, H, C, N, and Cl. In some aspects the specifically excluded chemical elements may be: (i) at least one chemical element from any one of Groups 2 to 13 and 18, including the lanthanoids and actinoids; (ii) at least one chemical element from any one of the third to sixth rows of the Periodic Table of the Elements, including the lanthanoids and actinoids; or (iii) both (i) and (ii), except not excluding Si, O, H, C, N, and Cl.

The invention is further illustrated by, and an invention embodiment may include any combinations of features and limitations of, the non-limiting examples thereof that follow. Ambient temperature is about 23° C. unless indicated otherwise.

EXAMPLES

Gas Chromatography-Flame Ionization Detector (GC-FID) conditions: a capillary column with 30 meters length, 0.32 mm inner diameter, and containing a 0.25 μm thick stationary phase in the form of a coating on the inner surface of the capillary column, wherein the stationary phase was composed of phenyl methyl siloxane. Carrier gas is helium gas used at a flow rate of 105 mL per minute. GC instrument is an Agilent model 7890A gas chromatograph. Inlet temperature is 150° C. GC experiment temperature profile consist of soaking (holding) at 50° C. for 2 minutes, ramping temperature up at a rate of 15° C./minute to 250° C., and then soaking (holding) at 250° C. for 10 minutes.

GC-MS instrument and conditions: Sample is analyzed by electron impact ionization and chemical ionization gas chromatography-mass spectrometry (EI GC-MS and CI GC-MS). Agilent 6890 GC conditions include a DB-1 column with 30 meters (m)×0.25 millimeter (mm)×0.50 micrometer (μm) film configuration. An oven program of soaking at 50° C. for 2 minutes, ramping at 15° C./minute to 250° C., and soaking at 250° C. for 10 minutes. Helium carrier gas flowing at constant flow of at 70 mL/minute and a 50:1 split injection. Agilent 5973 MSD conditions include a MS scan range from 15 to 800 Daltons, an EI ionization and CI ionization using a custom CI gas mix of 5% $NH_3$ and 95% $CH_4$.

$^{29}$Si-NMR instrument and solvent: a Varian 400 MHz Mercury spectrometer is used. $C_6D_6$ is used as the solvent.

$^1$H-NMR instrument and solvent: a Varian 400 MHz Mercury spectrometer is used. $C_6D_6$ is used as the solvent.

Preparation 1: synthesis of 1,2-bis(diethylamino)-1,1,2,2-tetrachlorodisilane: use the procedure of Schuh, Heinz; Schlosser, Thomas; Bissinger, Peter; Schmidbaur, Hubert; *Zeitschrift fuer Anorganische and Allgemeine Chemie*, 1993; 619 (8): 1347-1352.

Example 1: synthesis of a mixture of per(chloro,vinyl)disilanes using vinylmagnesium chloride. Added about 20.0 milliliters (mL) of 1.6 molar (M) vinylmagnesium chloride in THF to a 100 mL Schlenk flask, and removed the volatile components under vacuum to give a first residue. Added 10 mL of anhydrous diethyl ether to the residue, agitated the resulting mixture for 5 minutes, and removed the volatiles under vacuum to give a second residue. Added 5 mL of pentane to the second residue, agitated for 5 minutes, and removed volatiles under vacuum to give a third residue. Added 45 mL of anhydrous diethyl ether to the third residue, and agitated to give a slurry. Into a separate Schlenk flask charged 5.91 grams (g) of 1,1,1,2,2,2-hexachlorodisilane (HCDS) and 8.9 g of diethyl ether, and cooled the resulting HCDS solution to about −15° C. To the slurry formed previously added the HCDS solution over 15 minutes. Stirred the resulting reaction mixture (solution) for 15 minutes, and then warmed it to ambient temperature (about 23° C.). Stripped the resulting reaction product under vacuum to give 2.27 g of a mixture of chlorovinyldisilanes (41% yield).

Example 2: synthesis of a mixture of 1,1,1,2,2,2-hexavinyldisilane and per(chloro,vinyl)disilanes using divinylmagnesium. Added about 20.0 mL of 1.6 M vinylmagnesium chloride in THF to a 100 mL Schlenk flask. Added about 25 mL of 1,2-dimethoxyethane (DME), giving spontaneous formation of a precipitate. Removed all volatile components under reduced pressure to give a first residue. Added about 20 mL of anhydrous diethyl ether to the first residue, agitated the mixture, and removed volatile components under vacuum to give a second residue. Added about 75 mL of diethyl ether to the second residue to give a slurry. Into a separate 100 mL Schlenk flask added 4.30 g of HCDS. Added the previously prepared slurry to the HCDS over 30 minutes, and allowed the resulting reaction mixture to stir for 15 minutes to give a crude mixture of the per(chloro,vinyl)disilanes, 1,1,1,2,2,2-hexavinyldisilane, and unreacted HCDS in diethyl ether. Distilled the per(chloro,vinyl)disilanes from magnesium salts and the diethyl ether to give distilled per(chloro,vinyl)disilanes.

Example 3 (prophetic): in separate experiments purify the per(chloro,vinyl)disilanes of Examples 1 and 2 to give a plurality of purified per(chloro,vinyl)disilane compounds.

Example 4: synthesis of 1-diisopropylamino-1,1-dichloro-2,2,2-trivinyldisilane. Loaded 355.9 g of 1-di(1-methylethylamino)-1,1,2,2,2-pentachlorodisilane (DPDC) into a 5 liter (L), 3-neck flask, added 2 L of anhydrous diethyl ether, and cooled the resulting mixture to −18° C. To the cooled mixture added 2 L of 1.6 M vinylmagnesium chloride in THF over 3 hours with vigorous stirring, and stirred the resulting solution for 12 hours. Added 200 g of DME to the solution, and mixed result to precipitate magnesium salts and free any coordinated amines from the magnesium salts. Filtered the resulting product, to give a residue (filter) and filtrate. Washed the residue with 200 g of anhydrous diethyl ether to give a rinsate. Combined the filtrate and rinsate (liquid fractions), and concentrated the resulting combination under vacuum to give 247.74 g of crude 1-diisopropylamino-1,1-dichloro-2,2,2-trivinyldisilane (75.3% yield).

Example 5 (prophetic): distillation of 1-diisopropylamino-1,1-dichloro-2,2,2-trivinyldisilane. Distill the crude 1-diisopropylamino-1,1-dichloro-2,2,2-trivinyldisilane from Example 4 through a 15 centimeter (cm) length Vigreux column to give 1-diisopropylamino-1,1-dichloro-2,2,2-trivinyldisilane having a purity of ≥95 area % (GC).

Example 6: synthesis of 1,1,1-trichloro-2,2,2-trivinyldisilane. Dissolved 21.10 g of 1-diisopropylamino-1,1-dichloro-2,2,2-trivinyldisilane from Example 4 in 190 g pentane, and cooled the resulting solution to −22.0° C. To the cooled pentane solution added about 225 mL of 0.5 M HCl in diethyl ether with vigorous stirring over 2 hours. Copious amounts of white solid precipitated (presumably diisopropylamine hydrochloride). Cold filtered the reaction mixture below 0° C., and stripped the filtrate to give 15.54 g of crude 1,1,1-trichloro-2,2,2-trivinyldisilane (≥80 area % (GC) purity).

Example 7 (prophetic): purification of 1,1,1-trichloro-2,2,2-trivinyldisilane. Distill the crude 1,1,1-trichloro-2,2,2-trivinyldisilane of Example 6 under vacuum through an Oldershaw distillation column to give 1,1,1-trichloro-2,2,2-trivinyldisilane having a purity of ≥97 area % (GC).

Example 8: synthesis of 1,2-bis(N,N-diethylamino)-1,1,2,2-tetravinyldisilane.

Example A (prophetic): preparation of a silicon nitride film using 1,1,1-trichloro-2,2,2-trivinyldisilane with a nitrogen atom-containing precursor material (e.g., ammonia, molecular nitrogen, or a mixture of molecular nitrogen and molecular hydrogen). The preparation uses a PEALD method and apparatus comprising a PEALD reactor, a canister ("bubbler") containing 1,1,1-trichloro-2,2,2-trivinyldisilane, a means for maintaining the canister temperature, and a source of the nitrogen atom-containing precursor material. The PEALD reactor comprises a reactor chamber and a plasma generator in communication therewith. The reactor chamber is disposed for being, when desired, in independent and separate fluid communication with the source of the nitrogen atom-containing precursor material and the canister. The bubbler containing 1,1,1-trichloro-2,2,2-trivinyldisilane is maintained at room temperature. Load a plurality of horizontally-oriented and spaced apart silicon wafers having exposed surfaces into the reactor chamber, and purge the resulting loaded reactor chamber with a purge gas (molecular nitrogen gas). Heat the purged reactor chamber to a reactor temperature from 350° to 500° C., wherein the reactor temperature is different for different runs (experiments). Then bubble a carrier gas (molecular nitrogen gas) through the 1,1,1-trichloro-2,2,2-trivinyldisilane in the canister, generating a vaporous mixture comprising 1,1,1-trichloro-2,2,2-trivinyldisilane and $N_2(g)$. Feed the vaporous mixture into the purged reactor chamber. Stop the feed of such vaporous mixture, and then purge the reactor chamber again with molecular nitrogen gas to remove any residual vapor of 1,1,1-trichloro-2,2,2-trivinyldisilane therefrom. Next, power on the plasma generator of the PEALD reactor, and flow the nitrogen atom-containing precursor material from its source into the reactor chamber. Stop the generation of plasma, and then purge the reactor chamber again with molecular nitrogen gas to remove any residual reactive species that has been generated by the plasma. Repeat the foregoing sequence of steps (not including the loading step) until conformal silicon nitride films with desired thicknesses are formed on the exposed surfaces of the wafers. All other things being equal, the more times the sequence is repeated, the thicker the conformal silicon nitride films. Make one cycle of film formation to one sequence of a one second feed of the nitrogen atom-containing precursor material (a 1-second precursor dose), followed by a 30 second nitrogen gas purge, followed by a 15 second plasma treatment, followed by a 30 second nitrogen gas purge.

The below claims are incorporated by reference here, and the terms "claim" and "claims" are replaced by the term "aspect" or "aspects," respectively. Embodiments of the invention also include these resulting numbered aspects.

The invention claimed is:

1. A SiH-free vinyldisilane compound independently consisting of 6 silicon-bonded substituents selected from 1 to 5 silicon-bonded vinyl groups, 0 to 4 silicon-bonded chlorine atoms, and 1 to 5 silicon-bonded dialkylamino groups, respectively.

2. The SiH-free vinyldisilane compound of claim 1 wherein the silicon-bonded substituents are selected from 1 to 5 silicon-bonded vinyl groups and from 1 to 5 silicon-bonded dialkylamino groups, respectively.

3. The SiH-free vinyldisilane compound of claim 2 that is a per(dialkylamino,vinyl)disilane independently selected from 1,2-bis(N,N-diethylamino)-1,1,2,2-tetravinyldisilane and 1,2-bis(N,N-di(1-methylethyl)amino)-1,1,2,2-tetravinyldisilane.

4. The SiH-free vinyldisilane compound of claim 1 wherein the silicon-bonded substituents are selected from 1 to 4 silicon-bonded vinyl groups, 1 to 4 silicon-bonded chlorine atoms, and 1 to 4 silicon-bonded dialkylamino groups, respectively.

5. The SiH-free vinyldisilane compound of claim 4 that is a per(chloro,dialkylamino,vinyl)disilane independently selected from 1,2-bis(N,N-diethylamino)-1,1-dichloro-2,2-divinyldisilane; 1-(N,N-di(1-methylethyl)amino)-1,1,2,2-tetrachloro-2-vinyldisilane; 1-(N,N-di(1-methylethyl)amino)-1,1,2-trichloro-2,2-divinyldisilane; and 1-(N,N-di(1-methylethyl)amino)-1,1-dichloro-2,2,2-trivinyldisilane.

6. A method of making a SiH-free vinyldisilane compound independently consisting of 6 silicon-bonded substituents selected from 1 to 5 silicon-bonded vinyl groups, 0 to 4 silicon-bonded chlorine atoms, and 1 to 5 silicon-bonded dialkylamino groups, respectively, the method comprising contacting a SiH-free chlorodisilane compound independently consisting of 6 silicon-bonded substituents selected from 1 to 6 silicon-bonded chlorine atoms and 1 to 5 silicon-bonded dialkylamino groups with from 1 to 5 mole equivalents of a vinylmagnesium chloride or with from 0.5 to 2.5 mole equivalents of divinylmagnesium to give a reaction product comprising the SiH-free vinyldisilane compound.

7. A method of treating an initial surface of a substrate, the method comprising a first contacting step comprising contacting the initial surface of the substrate with a vapor of a SiH-free vinyldisilane compound of claim 1, using a first deposition method to give a product comprising a treated surface on the substrate.

8. A method of making a silicon-heteroatom compound, the method comprising a first contacting step comprising contacting an initial surface of a substrate with a vapor of a SiH-free vinyldisilane compound of claim 1, using a first deposition method to give a treated surface on the substrate; and a second contacting step comprising contacting the treated surface of the substrate with a vapor or plasma of a precursor material containing nitrogen atom(s), oxygen atom(s), carbon atom(s), or a combination of any two or more atoms thereof using a second deposition method to give a product comprising a silicon-heteroatom compound formed with or on treated surface of the substrate.

9. The method of claim 8 wherein the precursor material containing nitrogen atom(s) is molecular nitrogen, ammonia, hydrazine, an organohydrazine, hydrogen azide, a primary amine, or a secondary amine; the precursor material containing oxygen atom(s) is molecular oxygen, ozone, water, nitrous oxide ($N_2O$), or hydrogen peroxide; and the precursor material containing carbon atom(s) is methane, ethane, propane, a butane, a chloromethylsilane, a permethylsilane having from 1 to 5 Si atoms, or a methylhydridosilane having 1 to 5 Si atoms.

10. The method of claim 8 further comprising a step of separating the silicon-heteroatom compound of the product from the substrate of the product so as to give the separated silicon-heteroatom compound as a free-standing bulk form.

* * * * *